(12) United States Patent
Aso et al.

(10) Patent No.: US 11,424,100 B2
(45) Date of Patent: Aug. 23, 2022

(54) CHARGED PARTICLE BEAM IRRADIATION APPARATUS AND CONTROL METHOD

(71) Applicant: HITACHI HIGH-TECH SCIENCE CORPORATION, Tokyo (JP)

(72) Inventors: Takuma Aso, Tokyo (JP); Xin Man, Tokyo (JP); Makoto Sato, Tokyo (JP); Tatsuya Asahata, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 17/027,312

(22) Filed: Sep. 21, 2020

(65) Prior Publication Data

US 2021/0090855 A1 Mar. 25, 2021

(30) Foreign Application Priority Data

Sep. 24, 2019 (JP) .............................. JP2019-173369

(51) Int. Cl.
*H01J 37/26* (2006.01)
*H01J 37/28* (2006.01)
*H01J 37/244* (2006.01)
*G01N 23/2251* (2018.01)
(Continued)

(52) U.S. Cl.
CPC ........ *H01J 37/265* (2013.01); *G01N 23/2206* (2013.01); *G01N 23/2251* (2013.01); *G01N 23/2258* (2013.01); *H01J 37/244* (2013.01); *H01J 37/28* (2013.01);
(Continued)

(58) Field of Classification Search
CPC ........ H01J 37/265; H01J 37/28; H01J 37/244;
H01J 37/147; H01J 37/261; H01J 37/22;
H01J 37/317; H01J 2237/31749; G01N 23/2251; G01N 23/2206; G01N 23/2258;
G01N 2223/0816; G01N 2223/507; G01N 2223/40; G01N 2223/072; G01N 23/2208;
(Continued)

(56) References Cited

U.S. PATENT DOCUMENTS 9,347,896 B2 * 5/2016 Man .................... G01N 23/2202
9,548,185 B2 * 1/2017 Suzuki ..................... G01N 1/32
9,761,409 B2 * 9/2017 Nomaguchi .......... H01J 37/147
(Continued)

FOREIGN PATENT DOCUMENTS

JP   2011-086606 A   4/2011
JP   2018-163822 A   10/2018

*Primary Examiner* — David A Vanore
(74) *Attorney, Agent, or Firm* — Holland & Hart LLP

(57) ABSTRACT

The charged particle beam irradiation apparatus includes: a focused ion beam column; an electron beam column; an electron detector; an image forming unit configured to form an observation image based on a signal output from the electron detector; and a control unit configured to repeatedly perform exposure control in which the focused ion beam column is controlled to expose a cross section of a multi-layered sample toward a stacking direction with the focused ion beam, the control unit being configured to perform, every time exposure of an observation target layer at a cross section of the multilayered sample is detected in a process of repeatedly performing the exposure control, observation control in which the electron beam column is controlled to radiate the electron beam, and the image forming unit is controlled to form an observation image of the cross section of the multilayered sample.

16 Claims, 10 Drawing Sheets

(51) Int. Cl.
*G01N 23/2206* (2018.01)
*G01N 23/2258* (2018.01)

(52) U.S. Cl.
CPC .............. *G01N 2223/072* (2013.01); *G01N 2223/0816* (2013.01); *G01N 2223/40* (2013.01); *G01N 2223/507* (2013.01)

(58) Field of Classification Search
CPC ............. G01N 2223/41; G01N 23/225; G01N 2223/6116; G01N 1/28
See application file for complete search history.

(56) References Cited

U.S. PATENT DOCUMENTS

| | | | |
|---|---|---|---|
| 2010/0213386 A1* | 8/2010 | Man | G01N 1/32 250/400 |
| 2012/0205785 A1* | 8/2012 | Bouet | H01L 21/32137 257/632 |
| 2013/0075606 A1* | 3/2013 | Uemoto | G01N 23/2208 250/310 |
| 2013/0210618 A1* | 8/2013 | Mitlin | B01J 20/0248 502/302 |
| 2014/0131575 A1* | 5/2014 | Uemoto | G01N 23/2255 250/307 |
| 2014/0291508 A1* | 10/2014 | Uemoto | H01J 37/222 250/306 |
| 2015/0053866 A1* | 2/2015 | Aramaki | G21K 1/14 250/423 R |
| 2015/0206706 A1* | 7/2015 | Man | H01J 37/20 250/307 |
| 2015/0228450 A1* | 8/2015 | Uemoto | H01J 37/18 250/311 |
| 2016/0064187 A1* | 3/2016 | Tomimatsu | H01J 37/20 250/453.11 |
| 2016/0093464 A1* | 3/2016 | Suzuki | H01J 37/20 250/442.11 |
| 2016/0247662 A1* | 8/2016 | Fujii | H01J 37/305 |
| 2017/0278668 A1* | 9/2017 | Man | H01J 37/222 |
| 2021/0090850 A1* | 3/2021 | Muraki | H01J 37/304 |
| 2021/0090851 A1* | 3/2021 | Muraki | H01J 37/304 |

\* cited by examiner

CHARGED PARTICLE BEAM IRRADIATION APPARATUS AND CONTROL METHOD

The present application claims priorities to Japanese Patent Application No. 2019-173369, filed Sep. 24, 2019, the entire contents of which is incorporated herein for all purposes by this reference.

BACKGROUND OF THE INVENTION

1. Field of the Invention

The present invention relates to a charged particle beam irradiation apparatus and a control method.

2. Description of the Related Art

Research and development have been conducted on a technology of a charged particle beam irradiation apparatus configured to irradiate a sample with a charged particle beam.

In this respect, there is known a charged particle beam irradiation apparatus including a focused ion beam column configured to irradiate a sample with a focused ion beam, an electron beam column configured to irradiate the sample with an electron beam, and an electron detector configured to detect secondary particles or reflection electrons generated from the sample, the charged particle beam irradiation apparatus being configured to form an observation image of the sample based on a signal output from the electron detector (see Japanese Patent Application Laid-open Nos. 2011-086606 and 2018-163822).

As the sample to be observed for an internal substance or structure thereof by such a related-art charged particle beam irradiation apparatus as described in Japanese Patent Application Laid-open Nos. 2011-086606 and 2018-163822, there is a multilayered sample. The "multilayered sample" refers to a sample (for example, 3D-NAND flash memory) in which a plurality of observation target layers are stacked in a predetermined stacking direction. An "observation target layer" refers to a layer formed of a substance to be observed (for example, semiconductor). Further, in the multilayered sample, one or more non-observation target layers are often stacked in the stacking direction together with the plurality of observation target layers. A "non-observation target layer" refers to a layer formed of a substance not to be observed (for example, metal conductor used as a transmission line for power or a signal).

The related-art charged particle beam irradiation apparatus is capable of exposing, by etching a surface of such a multilayered sample as described above, a cross section of the multilayered sample obtained when the multilayered sample is cut at a desired plane. At this time, the charged particle beam irradiation apparatus is capable of exposing, by etching a surface of the multilayered sample as a layer in the stacking direction, a desired one of the plurality of layers as the cross section of the multilayered sample. In this specification, etching a surface of the multilayered sample as a layer in the stacking direction as described above is described as "exposing a cross section of the multilayered sample".

Here, in the related-art charged particle beam irradiation apparatus, a cut-and-see procedure is repeatedly performed to observe a substance or structure of each of the observation target layers included in the multilayered sample. The "cut-and-see procedure" refers to processing of exposing a cross section of the multilayered sample and forming an observation image of the exposed cross section.

However, in observing the substance or structure of each of the observation target layers, observation images of the non-observation target layers are unnecessary. Further, in observing the substance or structure of one of the plurality of observation target layers, the required number of observation images of the observation target layer is generally one. This means that, in observing the substance or structure of each of the plurality of observation target layers included in the multilayered sample, the related-art charged particle beam irradiation apparatus spends unnecessary time by repeating the cut-and-see procedure. The charged particle beam irradiation apparatus is difficult to reduce the time required to observe the substance or structure of each of the plurality of observation target layers included in the multilayered sample in some cases because of such a waste of unnecessary time.

SUMMARY OF THE INVENTION

The present invention has been made in view of the problem in the related art described above, and therefore provides a charged particle beam irradiation apparatus and a control method, with which time required to observe a substance or structure of each of a plurality of observation target layers included in a multilayered sample can be reduced.

According to at least one embodiment of the present invention, there is provided a charged particle beam irradiation apparatus, including: a focused ion beam column configured to irradiate, with a focused ion beam, a multilayered sample in which a plurality of layers having one of different substances and different structures from one another are stacked in a predetermined stacking direction as observation target layers to be observed; an electron beam column configured to irradiate the multilayered sample with an electron beam; an electron detector configured to detect one of secondary electrons and reflection electrons generated from the multilayered sample; an image forming unit configured to form an observation image based on a signal output from the electron detector; and a control unit configured to repeatedly perform exposure control in which the focused ion beam column is controlled to expose a cross section of the multilayered sample toward the predetermined stacking direction with the focused ion beam, the control unit being configured to perform, every time exposure of one of the observation target layers at a cross section of the multilayered sample is detected in a process of repeatedly performing the exposure control, observation control in which the electron beam column is controlled to radiate the electron beam, and the image forming unit is controlled to form an observation image of the cross section of the multilayered sample.

Further, according to at least one embodiment of the present invention, in the charged particle beam irradiation apparatus, the following configuration may be employed. That is, the charged particle beam irradiation apparatus may further include a storage unit having stored therein design data of the multilayered sample, and the control unit may be configured to: determine, based on the design data stored in the storage unit, whether exposure of one of the observation target layers at a cross section of the multilayered sample is detected in the process; and perform the observation control when determining that exposure of one of the observation target layers at a cross section of the multilayered sample is detected in the process.

Still further, according to at least one embodiment of the present invention, in the charged particle beam irradiation apparatus, the following configuration may be employed. That is, the control unit may be configured to: determine, based on the design data stored in the storage unit, and on a received error range, whether exposure of one of the observation target layers at a cross section of the multilayered sample is detected in the process; and repeat sequentially performing the exposure control and the observation control a predetermined number of times when determining that exposure of one of the observation target layers at a cross section of the multilayered sample is detected in the process.

Still further, according to at least one embodiment of the present invention, in the charged particle beam irradiation apparatus, the following configuration may be employed. That is, the control unit may be configured to set a first working pitch in the exposure control that is repeated the predetermined number of times to be smaller than a second working pitch in the exposure control that is different from the exposure control that is repeated the predetermined number of times.

Still further, according to at least one embodiment of the present invention, in the charged particle beam irradiation apparatus, the following configuration may be employed. That is, the control unit may be configured to: control the focused ion beam column to radiate the focused ion beam, and control the image forming unit to form a progress observation image, which indicates progress of working the multilayered sample with the focused ion beam, every time the exposure control is performed in the process; determine, based on the progress observation image formed every time the exposure control is performed, and on the design data stored in the storage unit, whether exposure of one of the observation target layers at a cross section of the multilayered sample is detected in the process; and perform the observation control when determining that exposure of one of the observation target layers at a cross section of the multilayered sample is detected in the process.

Still further, according to at least one embodiment of the present invention, in the charged particle beam irradiation apparatus, the following configuration may be employed. That is, the control unit may be configured to: control the focused ion beam column and the electron beam column to perform the exposure control and the observation control in parallel with each other; determine, based on an observation image of a cross section of the multilayered sample, which is formed every time the observation control is performed in parallel with the exposure control, whether exposure of one of the observation target layers at a cross section of the multilayered sample is detected in the process; and perform the observation control when determining that exposure of one of the observation target layers at a cross section of the multilayered sample is detected in the process.

Still further, according to at least one embodiment of the present invention, in the charged particle beam irradiation apparatus, the following configuration may be employed. That is, the control unit may be configured to: determine, based on the observation image of the cross section of the multilayered sample, which is formed every time the observation control is performed in parallel with the exposure control, and on a machine learning model obtained by learning in advance an image of each of the observation target layers, whether exposure of one of the observation target layers at a cross section of the multilayered sample is detected in the process; and perform the observation control when determining that exposure of one of the observation target layers at a cross section of the multilayered sample is detected in the process.

Still further, according to at least one embodiment of the present invention, in the charged particle beam irradiation apparatus, the following configuration may be employed. That is, the control unit may be configured to: determine, based on the observation image of the cross section of the multilayered sample, which is formed every time the observation control is performed in parallel with the exposure control, and on pattern matching with an image of each of the observation target layers, whether exposure of one of the observation target layers at a cross section of the multilayered sample is detected in the process; and perform the observation control when determining that exposure of one of the observation target layers at a cross section of the multilayered sample is detected in the process.

Still further, according to at least one embodiment of the present invention, there is provided a control method for a charged particle beam irradiation apparatus including: a focused ion beam column configured to irradiate, with a focused ion beam, a multilayered sample in which a plurality of layers having one of different substances and different structures from one another are stacked in a predetermined stacking direction as observation target layers to be observed; an electron beam column configured to irradiate the multilayered sample with an electron beam; an electron detector configured to detect one of secondary electrons and reflection electrons generated from the multilayered sample; and an image forming unit configured to form an observation image based on a signal output from the electron detector, the control method including: repeatedly performing exposure control in which the focused ion beam column is controlled to expose a cross section of the multilayered sample toward the predetermined stacking direction with the focused ion beam; and performing, every time exposure of one of the observation target layers at a cross section of the multilayered sample is detected in a process of repeatedly performing the exposure control, observation control in which the electron beam column is controlled to radiate the electron beam, and the image forming unit is controlled to form an observation image of the cross section of the multilayered sample.

Still further, according to at least one embodiment of the present invention, in the control method, the following configuration may be employed. That is, the charged particle beam irradiation apparatus may further include a storage unit having stored therein design data of the multilayered sample, and the control method may further include: determining, based on the design data stored in the storage unit, whether exposure of one of the observation target layers at a cross section of the multilayered sample is detected in the process; and performing the observation control when determining that exposure of one of the observation target layers at a cross section of the multilayered sample is detected in the process.

Still further, according to at least one embodiment of the present invention, in the control method, the following configuration may be employed. That is, the control method may further include: determining, based on the design data stored in the storage unit, and on a received error range, whether exposure of one of the observation target layers at a cross section of the multilayered sample is detected in the process; and repeating sequentially performing the exposure control and the observation control a predetermined number of times when determining that exposure of one of the observation target layers at a cross section of the multilayered sample is detected in the process.

Still further, according to at least one embodiment of the present invention, in the control method, the following configuration may be employed. That is, the control method may further include setting a first working pitch in the exposure control that is repeated the predetermined number of times to be smaller than a second working pitch in the exposure control that is different from the exposure control that is repeated the predetermined number of times.

Still further, according to at least one embodiment of the present invention, in the control method, the following configuration may be employed. That is, the control method may further include: controlling the focused ion beam column to radiate the focused ion beam, and controlling the image forming unit to form a progress observation image, which indicates progress of working the multilayered sample with the focused ion beam, every time the exposure control is performed in the process; determining, based on the progress observation image formed every time the exposure control is performed, and on the design data stored in the storage unit, whether exposure of one of the observation target layers at a cross section of the multilayered sample is detected in the process; and performing the observation control when determining that exposure of one of the observation target layers at a cross section of the multilayered sample is detected in the process.

Still further, according to at least one embodiment of the present invention, in the control method, the following configuration may be employed. That is, the control method may further include: controlling the focused ion beam column and the electron beam column to perform the exposure control and the observation control in parallel with each other; determining, based on an observation image of a cross section of the multilayered sample, which is formed every time the observation control is performed in parallel with the exposure control, whether exposure of one of the observation target layers at a cross section of the multilayered sample is detected in the process; and performing the observation control when determining that exposure of one of the observation target layers at a cross section of the multilayered sample is detected in the process.

Still further, according to at least one embodiment of the present invention, in the control method, the following configuration may be employed. That is, the control method may further include: determining, based on the observation image of the cross section of the multilayered sample, which is formed every time the observation control is performed in parallel with the exposure control, and on a machine learning model obtained by learning in advance an image of each of the observation target layers, whether exposure of one of the observation target layers at a cross section of the multilayered sample is detected in the process; and performing the observation control when determining that exposure of one of the observation target layers at a cross section of the multilayered sample is detected in the process.

Still further, according to at least one embodiment of the present invention, in the control method, the following configuration may be employed. That is, the control method may further include: determining, based on the observation image of the cross section of the multilayered sample, which is formed every time the observation control is performed in parallel with the exposure control, and on pattern matching with an image of each of the observation target layers, whether exposure of one of the observation target layers at a cross section of the multilayered sample is detected in the process; and performing the observation control when determining that exposure of one of the observation target layers at a cross section of the multilayered sample is detected in the process.

According to the present invention, it is possible to provide the charged particle beam irradiation apparatus and the control method, with which time required to observe the substance or structure of each of the plurality of observation target layers included in the multilayered sample can be reduced.

DESCRIPTION OF THE EMBODIMENTS

Embodiment

In the following, a description is given of an embodiment of the present invention with reference to the drawings.

Figure 1:
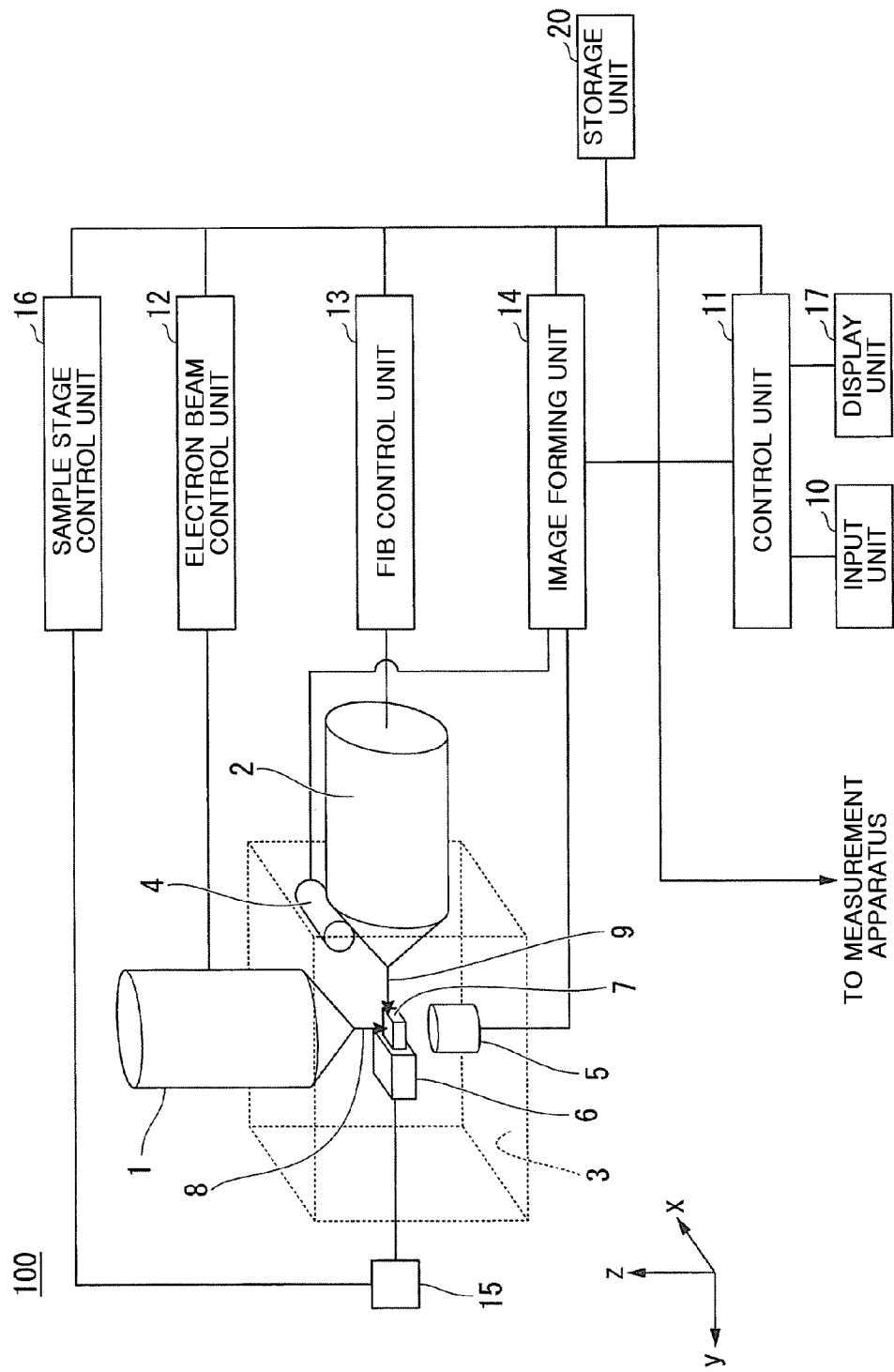
FIG. 1 is a diagram for illustrating an example of a configuration of a charged particle beam irradiation apparatus (100) according to at least one embodiment of the present invention.

FIG. 1 is a diagram for illustrating an example of a configuration of a charged particle beam irradiation apparatus 100 according to at least one embodiment of the present invention. The charged particle beam irradiation apparatus 100 includes an electron beam column 1, a focused ion beam column 2, and a sample chamber 3.

The electron beam column 1 is configured to irradiate a multilayered sample 7, which is housed in the sample chamber 3, with an electron beam 8. In the example illustrated in FIG. 1, an axial direction of an irradiation axis of the electron beam column 1 is parallel to the direction of gravity. Therefore, in the following description, the direction of gravity is referred to as "downward" or "down direction", and a direction opposite to the direction of gravity is referred to as "upward" or "up direction" for convenience of description. In other words, in this example, the electron beam column 1 is configured to radiate the electron beam 8 substantially downward.

The "multilayered sample 7" refers to a sample in which a plurality of observation target layers are stacked in a predetermined stacking direction. An "observation target layer" refers to a layer formed of a substance to be observed (for example, semiconductor). Further, in the multilayered sample, one or more non-observation target layers are often stacked in the stacking direction together with the plurality of observation target layers. A "non-observation target layer" refers to a layer formed of a substance not to be observed (for example, metal conductor used as a transmission line for power or a signal). The multilayered sample 7 is 3D-NAND flash memory, for example. In this case, in the multilayered sample 7, the plurality of observation target layers and non-observation target layers are stacked alternately in the stacking direction. A description is given below, as an example, of a case in which the multilayered sample 7 is a sample in which the plurality of observation target layers and non-observation target layers are stacked alternately in the stacking direction. The stacking direction may be any direction. A description is given below, as an example, of a case in which the stacking direction in the multilayered sample 7 housed in the sample chamber 3 is parallel to the up and down direction. In this case, the electron beam column 1 is capable of scanning a surface parallel to each of the observation target layers and the non-observation target layers, which are included in the multilayered sample 7, with the electron beam 8.

The focused ion beam column 2 is configured to irradiate the multilayered sample 7, which is housed in the sample chamber 3, with a focused ion beam 9. In the example illustrated in FIG. 1, the electron beam column 1 and the focused ion beam column 2 are arranged so that irradiation axes thereof are orthogonal to each other on the multilayered sample 7. In other words, in this example, the electron beam column 1 is configured to irradiate the multilayered sample 7 with the electron beam 8 in a direction orthogonal to the direction in which the focused ion beam 9 is radiated. Therefore, in this example, the irradiation axis of the focused ion beam column 2 is parallel to each of the observation target layers and the non-observation target layers, which are included in the multilayered sample 7. The electron beam column 1 and the focused ion beam column 2 may have a configuration of being arranged so that the irradiation axes thereof cross obliquely on the multilayered sample 7.

The charged particle beam irradiation apparatus 100 also includes a secondary electron detector 4 and a transmission electron detector 5 as electron detectors. Those electron detectors, such as the secondary electron detector 4 and the transmission electron detector 5, are configured to detect secondary electrons or reflection electrons generated from the multilayered sample 7.

Specifically, the secondary electron detector 4 is configured to detect the secondary electrons generated from the multilayered sample 7 irradiated with the electron beam 8 or the focused ion beam 9. The transmission electron detector 5 is provided at a position opposed to the electron beam column 1. The transmission electron detector 5 is configured to detect, as a result of the multilayered sample 7 being irradiated with the electron beam 8, transmission electrons, which have transmitted through the multilayered sample 7, and the electron beam 8 that has not entered the multilayered sample 7.

The charged particle beam irradiation apparatus 100 further includes a sample stage 6 configured to hold the multilayered sample 7. The sample stage 6 is driven by a sample stage drive unit 15 under control of a sample stage control unit 16.

The sample stage drive unit 15 is configured to shift the sample stage 6 in three axial directions of an x-axis direction, a y-axis direction, and a z-axis direction, and directions of rotation around respective axes. Here, an x axis, a y axis, and a z axis are orthogonal to one another. The z axis has a positive direction in the up direction, and is orthogonal to a plane formed by the x axis and the y axis. In other words, in the example illustrated in FIG. 1, in the charged particle beam irradiation apparatus 100, the electron beam column 1 is arranged so that the axial direction of the irradiation axis thereof is parallel to the z-axis direction.

The charged particle beam irradiation apparatus 100 further includes an electron beam control unit 12, a focused ion beam control unit 13, an image forming unit 14, and a display unit 17.

The electron beam control unit 12 is configured to output an irradiation signal to the electron beam column 1 under control of a control unit 11 to control the electron beam column 1 to radiate the electron beam 8.

The focused ion beam control unit 13 is configured to output an irradiation signal to the focused ion beam column 2 under control of the control unit 11 to control the focused ion beam column 2 to radiate the focused ion beam 9.

The image forming unit 14 is configured to form a transmission electron image based on a signal for scanning with the electron beam 8 from the electron beam control unit 12, and on a signal of the transmission electrons detected by the transmission electron detector 5. The image forming unit 14 is configured to form data of a SEM image based on the signal for scanning with the electron beam 8 from the electron beam control unit 12, and on a signal of the secondary electrons detected by the secondary electron detector 4. Further, the image forming unit 14 is configured to form data of a SIM image based on a signal for scanning with the focused ion beam 9 from the focused ion beam control unit 13, and on the signal of the secondary electrons detected by the secondary electron detector 4.

The display unit 17 includes a liquid crystal display or other display devices, and is configured to display, for example, the above-mentioned transmission electron image, SEM image, and SIM image.

The charged particle beam irradiation apparatus 100 further includes an input unit 10 and the control unit 11. An operator of the charged particle beam irradiation apparatus 100 inputs conditions for controlling the apparatus to the input unit 10. The input unit 10 is configured to output the input information to the control unit 11.

The control unit 11 is configured to output a control signal to each of the electron beam control unit 12, the focused ion beam control unit 13, the image forming unit 14, the sample stage control unit 16, and the display unit 17 to control operation of the charged particle beam irradiation apparatus 100.

The charged particle beam irradiation apparatus 100 further includes a storage unit 20.

The storage unit 20 includes, for example, a hard disk drive and flash memory, and is configured to store various kinds of information.

<Control for Exposing a Cross Section of the Multilayered Sample and Control for Forming an Observation Image of the Cross Section of the Multilayered Sample>

Figure 2:
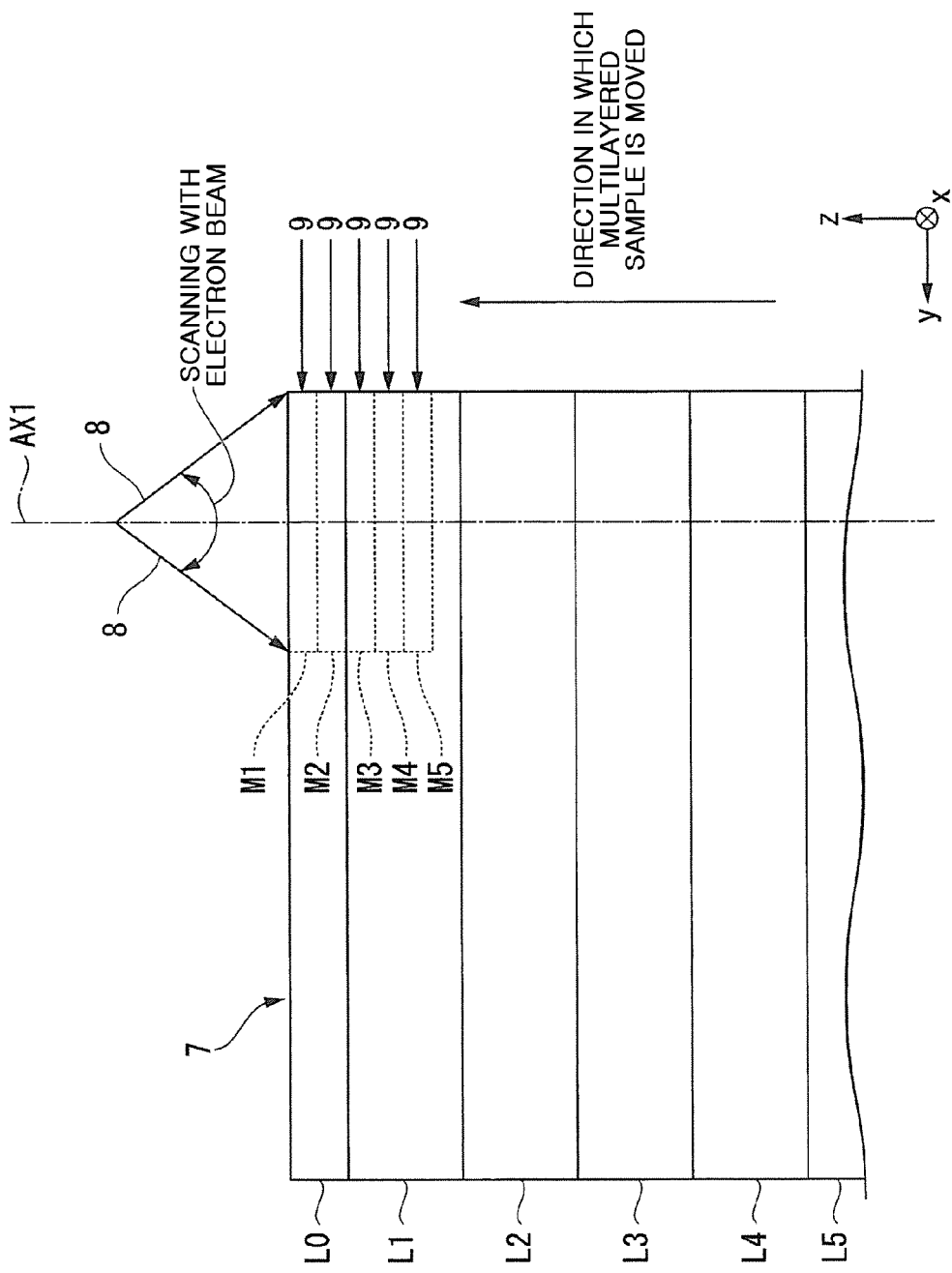
FIG. 2 is a view of a multilayered sample (7) as viewed in a positive direction of an x axis.
Figure 3:
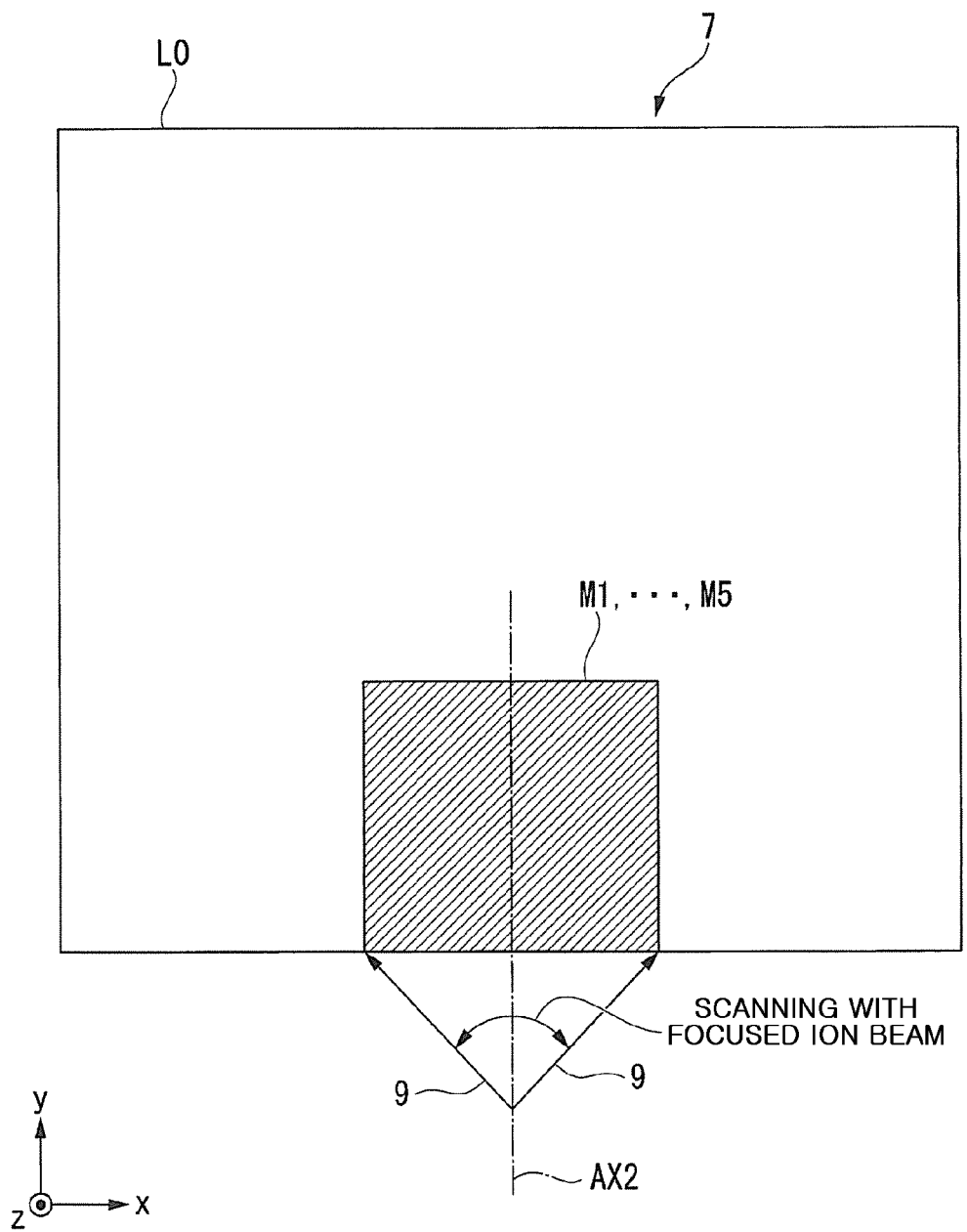
FIG. 3 is a view of the multilayered sample (7) illustrated in FIG. 2 as viewed in a negative direction of a z axis.

Now referring to FIG. 2 and FIG. 3, a description is given of control in which the charged particle beam irradiation apparatus 100 exposes a cross section of the multilayered sample 7 and control in which the charged particle beam irradiation apparatus 100 forms an observation image of the cross section of the multilayered sample 7. FIG. 2 is a view of the multilayered sample 7 as viewed in a positive direction of the x axis. FIG. 3 is a view of the multilayered sample 7 illustrated in FIG. 2 as viewed in a negative direction of the z axis.

An axis AX1 illustrated in FIG. 2 indicates an example of the irradiation axis of the electron beam column 1. An axis AX2 illustrated in FIG. 3 indicates an example of the irradiation axis of the focused ion beam column 2. As illustrated in FIG. 2, the axis AX1 as the irradiation axis of the electron beam column 1 coincides with the stacking direction (in this example, z-axis direction) as described above. Further, as illustrated in FIG. 3, the axis AX2 as the irradiation axis of the focused ion beam column 2 is orthogonal to the stacking direction (in this example, z-axis direction) as described above.

Further, each of a non-observation target layer L0, a non-observation target layer L2, and a non-observation target layer L4 illustrated in FIG. 2 is an example of the non-observation target layers included in the multilayered sample 7. Further, each of an observation target layer L1, an observation target layer L3, and an observation target layer L5 illustrated in FIG. 2 is an example of the observation target layers of the multilayered sample 7. In other words, the observation target layer L1, the observation target layer L3, and the observation target layer L5 are layers having different substances or structures from one another. Further, as illustrated in FIG. 2, in the multilayered sample 7, the non-observation target layer L0, the observation target layer L1, the non-observation target layer L2, the observation target layer L3, the non-observation target layer L4, and the observation target layer L5 are stacked in the stated order in the stacking direction.

Here, the charged particle beam irradiation apparatus 100 is configured to scan, based on working conditions stored in advance in the storage unit 20, the inside of a first scanning region (not shown) corresponding to the working conditions with the focused ion beam 9. As a result, the charged particle beam irradiation apparatus 100 is capable of etching the first scanning region, of forming an observation image of the first scanning region with the focused ion beam 9, and the like. The "working conditions" refer to information including first scanning region information indicating the first scanning region, information indicating an acceleration voltage, information indicating a beam current, information indicating a magnification, information indicating an OL voltage, information indicating a contrast, information indicating a brightness, information indicating a thickness of a layer to be cut away by etching, information indicating a depth of cutting by etching, and information indicating a distance from the focused ion beam column 2 to the surface of the multilayered sample 7, for example.

Further, the charged particle beam irradiation apparatus 100 is configured to control the electron beam column 1 to scan, based on observation conditions stored in advance in the storage unit 20, the inside of a second scanning region (not shown) corresponding to the observation conditions. As a result, the charged particle beam irradiation apparatus 100 is capable of forming an observation image of the second scanning region with the electron beam 8, and the like. The "observation conditions" refer to information including second scanning region information indicating the second scanning region, information indicating an acceleration voltage, information indicating a beam current, information indicating a magnification, information indicating an OL voltage, information indicating a contrast, information indicating a brightness, and information indicating a distance from the electron beam column 1 to the surface of the multilayered sample 7, for example.

As illustrated in FIG. 2, the charged particle beam irradiation apparatus 100 is configured to scan the first scanning region with the focused ion beam 9 based on the working conditions stored in advance in the storage unit 20 to etch the first scanning region as a layer. As a result, in the second scanning region (hatched region in FIG. 3), a cross section of the multilayered sample 7 is exposed. In the following description, etching the first scanning region as a layer to expose a cross section of the multilayered sample 7 in the second scanning region as described above is referred to as "exposure control" for convenience of description. Each of Layer M1 to Layer M5 illustrated in FIG. 2 represents, of parts included in the multilayered sample 7, an example of a part to be etched as a layer by scanning the first scanning region with the focused ion beam 9. For example, the charged particle beam irradiation apparatus 100 performs the exposure control to etch Layer M1 by scanning Layer M1 with the focused ion beam 9. As a result, the charged particle beam irradiation apparatus 100 exposes an upper surface of Layer M2 that has been covered with Layer M1, as a cross section of the multilayered sample 7, in the second scanning region. After exposing the cross section of the multilayered sample 7 in the second scanning region, the charged particle beam irradiation apparatus 100 scans the second scanning region with the electron beam 8 based on the observation conditions, which are stored in advance in the storage unit 20, and controls the image forming unit 14 to form an observation image of the second scanning region. In the following description, controlling the image forming unit 14 to form an observation image of the second scanning region as described above is referred to as "observation control" for convenience of description. After controlling the image forming unit 14 to form the observation image of the upper surface of Layer M2 through the observation control, the charged particle beam irradiation apparatus 100 moves the sample stage 6 in a positive direction of the z axis based on the working conditions. At this time, the charged particle beam irradiation apparatus 100 moves, based on the information indicating the thickness of the layer to be cut away by etching, of the information included in the working conditions, the sample stage 6 in the positive direction of the z axis by the thickness indicated by the information. Then, the charged particle beam irradiation apparatus 100 performs the exposure control, in which Layer M2 is etched by scanning Layer M2 with the focused ion beam 9 to expose an upper surface of Layer M3 that has been covered with Layer M2, as a cross section of the multilayered sample 7. The charged particle beam irradiation apparatus 100 can repeatedly perform, by performing the cut-and-see procedure, in which the exposure control and the observation control as described above are sequentially performed, exposing a cross section of the multilayered sample 7 and forming an observation image of the exposed cross section.

Here, in a case where a substance or structure of each of the plurality of observation target layers included in the multilayered sample 7 is to be observed, when the charged particle beam irradiation apparatus 100 forms an observation image every time a cross section of the multilayered sample 7 is exposed through the cut-and-see procedure described above, time required to observe the substance or structure of each of the plurality of observation target layers included in the multilayered sample 7 is disadvantageously increased.

To address this problem, every time exposure of one of the observation target layer L1, the observation target layer L3, and the observation target layer L5 included in the multilayered sample 7 at a cross section of the multilayered sample 7 is detected in the process of repeatedly exposing a cross section of the multilayered sample 7 (in the example illustrated in FIG. 2, process of etching each of Layer M1 to Layer M5), the charged particle beam irradiation apparatus 100 controls the electron beam column 1 to radiate the electron beam 8, and controls the image forming unit 14 to form the observation image of the exposed cross section of the multilayered sample 7. Stated differently, every time exposure of one of the observation target layer L1, the observation target layer L3, and the observation target layer L5 at a cross section of the multilayered sample 7 is detected in the process of repeatedly performing the exposure control, the charged particle beam irradiation apparatus 100 controls the electron beam column 1 to radiate the electron beam 8, and controls the image forming unit 14 to form the observation image of the exposed cross section of the multilayered sample 7. In other words, the charged particle beam irradiation apparatus 100 performs the observation control every time exposure of an observation target layer at a cross section of the multilayered sample 7 is detected in the process of repeatedly performing the exposure control. In the example illustrated in FIG. 2, when each of Layer M1 and Layer M2 is etched through the exposure control, the observation target layer L1 is exposed in the second scanning region, as a cross section of the multilayered sample 7. In other words, in this example, after etching Layer M1 and Layer M2 in the stated order by repeating the exposure control, the charged particle beam irradiation apparatus 100 controls the image forming unit 14 to form an observation image of the observation target layer L1 exposed in the second scanning region. Thereafter, when exposure of the observation target layer L3 at a cross section of the multilayered sample 7 is detected by repeating the exposure control again, the charged particle beam irradiation apparatus 100 controls the image forming unit 14 to form an observation image of the observation target layer L3 exposed in the second scanning region. By repeating such processing, the charged particle beam irradiation apparatus 100 does not have to form an unnecessary observation image, and as a result, can reduce the time required to observe the substance or structure of each of the plurality of observation target layers included in the multilayered sample 7. A detailed description is given below of processing in which the charged particle beam irradiation apparatus 100 forms an observation image of a cross section of the multilayered sample 7 every time exposure of an observation target layer at a cross section of the multilayered sample 7 is detected.

<Processing in Which the Charged Particle Beam Irradiation Apparatus Forms an Observation Image of a Cross Section of the Multilayered Sample Every Time Exposure of an Observation Target Layer at a Cross Section of the Multilayered Sample Is Detected>

Figure 4:
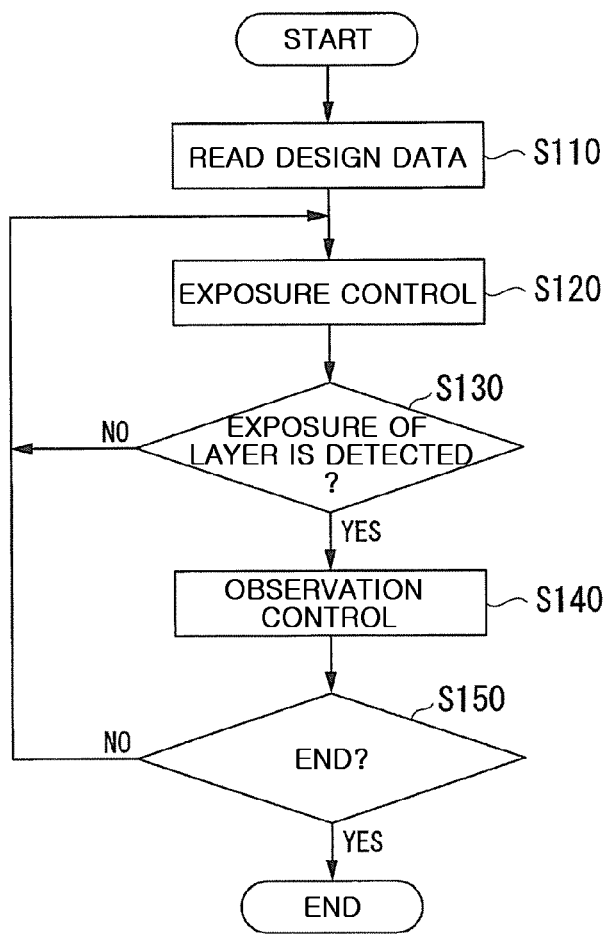
FIG. 4 is a flow chart for illustrating an example of processing in which the charged particle beam irradiation apparatus (100) forms an observation image of a cross section of the multilayered sample (7) every time exposure of an observation target layer at a cross section of the multilayered sample (7) is detected.

Now referring to FIG. 4, a description is given of the processing in which the charged particle beam irradiation apparatus 100 forms an observation image of a cross section of the multilayered sample 7 every time exposure of an observation target layer at a cross section of the multilayered sample 7 is detected. FIG. 4 is a flow chart for illustrating an example of the processing in which the charged particle beam irradiation apparatus 100 forms an observation image of a cross section of the multilayered sample 7 every time exposure of an observation target layer at a cross section of the multilayered sample 7 is detected.

A description is given below, as an example, of a case in which, at a timing before processing of Step S110 illustrated in FIG. 4 is performed, observation conditions and working conditions desired by a user are stored in advance in the storage unit 20. Further, a description is given below, as an example, of a case in which, at the timing, design data of the multilayered sample 7 is stored in advance in the storage unit 20.

Further, a description is given below, as an example, of a case in which, at a timing before the processing of Step S110 illustrated in FIG. 4 is performed, a working start cross section is exposed in advance by repeating the above-mentioned cut-and-see procedure. The "working start cross section" refers to, of cross sections of the multilayered sample 7, a cross section at which the multilayered sample 7 starts being etched by the processing of the flow chart illustrated in FIG. 4. A surface to be exposed as the working start cross section is, for example, a top surface of the observation target layer L1 illustrated in FIG. 2, but may be another surface. As a result, the charged particle beam irradiation apparatus 100 can expose, based on a unit cutting thickness, a desired surface as a cross section of the multilayered sample 7. The "unit cutting thickness" as used herein refers to a thickness by which the multilayered sample 7 is cut in the stacking direction every time the exposure control is performed. In the charged particle beam irradiation apparatus 100, the unit cutting thickness may be set to be different every time the exposure control is performed. In order to simplify the description, a description is given below, as an example, of a case in which the unit cutting thickness is the same every time the exposure control is performed.

The control unit 11 reads the design data of the multilayered sample 7, which is stored in advance in the storage unit 20, from the storage unit 20 (Step S110). The "design data" refers to data including information indicating the structure, dimensions, and the like of the multilayered sample 7, and is, for example, computer aided design (CAD) data.

Next, the control unit 11 performs the exposure control described above (Step S120). As a result, the charged particle beam irradiation apparatus 100 cuts the surface of the multilayered sample 7 by the unit cutting thickness as a layer to expose a cross section of the multilayered sample 7 in the second scanning region.

Next, the control unit 11 determines whether exposure of an observation target layer at a cross section of the multilayered sample 7 is detected (Step S130). For example, detecting exposure of an observation target layer at a cross section of the multilayered sample 7 is detecting that a top surface (or substantially the top surface) of an observation target layer is exposed at a cross section of the multilayered sample 7. Even when a surface that is slightly lower than the top surface of the observation target layer (for example, surface that is lower than the top surface by a thickness that is about several % of the unit cutting thickness) is exposed due to an etching error, in at least one embodiment of the present invention, it is regarded that the top surface of the observation target layer is exposed as the cross section of the multilayered sample 7.

Now, the processing of Step S130 is described in detail. In Step S130, the control unit 11 calculates, based on the number of times Step S130 has been executed, a total amount of thickness cut from the working start cross section. For convenience of description, the control unit 11 determines, based on the calculated total amount, and on the design data read in Step S110, whether the layer exposed as the cross section of the multilayered sample 7 by the processing of Step S120 executed last time is a top surface of any one of the plurality of observation target layers. When determining that the layer exposed as the cross section of the multilayered sample 7 by the processing of Step S120 executed last time is not the top surface of the observation target layer, the control unit 11 determines that exposure of an observation target layer at a cross section of the multilayered sample 7 is not detected. In contrast, when determining that the layer exposed as the cross section of the multilayered sample 7 by the processing of Step S120 executed last time is the top surface of the observation target layer, the control unit 11 determines that exposure of an observation target layer at a cross section of the multilayered sample 7 is detected.

The control unit 11 may be configured to determine, in Step S130, whether exposure of an observation target layer at a cross section of the multilayered sample 7 is detected, by another method based on the design data read in Step S110.

Further, detecting exposure of an observation target layer at a cross section of the multilayered sample 7 may be, instead of detecting that the top surface (or substantially the top surface) of the observation target layer is exposed at the cross section of the multilayered sample 7, detecting a preceding phenomenon indicating that the observation target layer is to be exposed at the cross section of the multilayered sample 7. In other words, detecting exposure of an observation target layer at a cross section of the multilayered sample 7 may be detecting some kind of the preceding phenomenon with which, before exposure of an observation target layer at a cross section of the multilayered sample 7 occurs, the exposure is predicted. The preceding phenomenon includes, for example, occurrence of some characteristic information depending on the substance or structure of the observation target layer at a layer above the observation target layer (for example, information indicating shades of brightness occurring in an observation image of the cross section of the multilayered sample 7 depending on the substance or structure of the observation target layer), electrons transmitted through the cross section of the multilayered sample 7 indicating the presence of the substance or structure of the observation target layer, and occurrence of some substance or structure located near the observation target layer in the layer above the observation target layer. The control unit 11 can detect the above-mentioned preceding phenomenon based on, for example, the observation image of the cross section of the multilayered sample 7, the signal output from the secondary electron detector 4, and the signal output from the transmission electron detector 5.

When determining that exposure of an observation target layer at a cross section of the multilayered sample 7 is not detected (Step S130; NO), the control unit 11 transitions to Step S120, in which the exposure control is performed again.

In contrast, when determining that exposure of an observation target layer at a cross section of the multilayered sample 7 is detected (Step S130; YES), the control unit 11 performs the observation control (Step S140), in which the image forming unit 14 is controlled to form an observation image of the currently exposed cross section of the multilayered sample 7. Then, the control unit 11 stores, in the storage unit 20, the observation image formed by the image forming unit 14. The control unit 11 may be configured to control the display unit 17 to display the observation image formed by the image forming unit 14 at this stage, or may be configured not to control the display unit 17 to display the observation image formed by the image forming unit 14 at this stage.

Next, the control unit 11 determines, based on the working conditions and the observation conditions stored in advance in the storage unit 20, whether to end forming an observation image of an observation target layer included in the multilayered sample 7 (Step S150).

When determining not to end forming an observation image of an observation target layer included in the multilayered sample 7 (Step S150; NO), the control unit 11 transitions to Step S120, in which the exposure control is performed again.

In contrast, when determining to end forming an observation image of an observation target layer included in the multilayered sample 7 (Step S150; YES), the control unit 11 ends the processing.

As described above, the charged particle beam irradiation apparatus 100 determines, based on the design data of the multilayered sample 7 stored in the storage unit 20, whether exposure of an observation target layer at a cross section of the multilayered sample 7 is detected in the process of repeatedly performing the exposure control (that is, process in which the processing of from Step S120 to Step S150 is repeated), and performs the observation control when determining that exposure of an observation target layer at a cross section of the multilayered sample 7 is detected in the process. As a result, the charged particle beam irradiation apparatus 100 can reduce the time required to observe the substance or structure of each of the plurality of observation target layers included in the multilayered sample based on the design data.

<Modification Example 1 of the Processing in Which the Charged Particle Beam Irradiation Apparatus Forms an Observation Image of a Cross Section of the Multilayered Sample Every Time Exposure of an Observation Target Layer at a Cross Section of the Multilayered Sample Is Detected>

Figure 5:
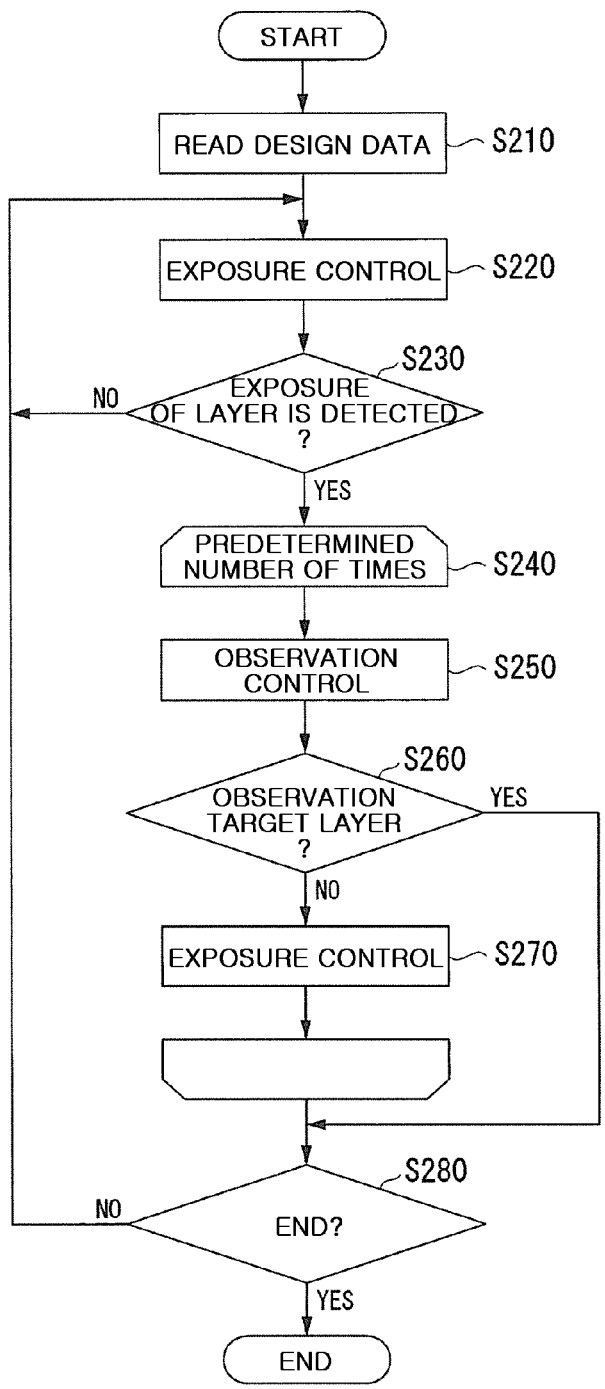
FIG. 5 is a flow chart for illustrating Modification Example 1 as an example of the processing in which the charged particle beam irradiation apparatus (100) forms an observation image of a cross section of the multilayered sample (7) every time exposure of an observation target layer at a cross section of the multilayered sample (7) is detected.

Now referring to FIG. 5, a description is given of Modification Example 1 of the processing in which the charged particle beam irradiation apparatus 100 forms an observation image of a cross section of the multilayered sample 7 every time exposure of an observation target layer at a cross section of the multilayered sample 7 is detected. FIG. 5 is a flow chart for illustrating Modification Example 1 as an example of the processing in which the charged particle beam irradiation apparatus 100 forms an observation image of a cross section of the multilayered sample 7 every time exposure of an observation target layer at a cross section of the multilayered sample 7 is detected.

A description is given below, as an example, of a case in which, at a timing before processing of Step S210 illustrated in FIG. 5 is performed, observation conditions and working conditions desired by a user are stored in advance in the storage unit 20. Further, a description is given below, as an example, of a case in which, at the timing, design data of the multilayered sample 7 is stored in advance in the storage unit 20.

Further, a description is given below, as an example, of a case in which, at a timing before the processing of Step S210 illustrated in FIG. 5 is performed, a working start cross section is exposed in advance by repeating the above-mentioned cut-and-see procedure.

Further, a description is given below, as an example, of a case in which, at a timing before the processing of Step S210 illustrated in FIG. 5 is performed, error range information indicating an error range is stored in advance in the storage unit 20. The "error range" refers to a range of an error obtained by adding together an error in unit cutting thickness and an error in position of the working start cross section in the stacking direction. The error range may be a range of one of the error in unit cutting thickness and the error in position of the working start cross section in the stacking direction.

The processing of Step S210 illustrated in FIG. 5 is processing similar to the processing of Step S110 illustrated in FIG. 4, and hence a description thereof is omitted. Further, processing of Step S220 illustrated in FIG. 5 is processing similar to the processing of Step S120 illustrated in FIG. 4, and hence a description thereof is omitted. Still further, processing of Step S280 illustrated in FIG. 5 is processing similar to the processing of Step S150 illustrated in FIG. 4, and hence a description thereof is omitted.

After the processing of Step S220 is performed, the control unit 11 determines whether exposure of an observation target layer at a cross section of the multilayered sample 7 is detected (Step S230).

Now, the processing of Step S230 is described in detail. In Step S230, the control unit 11 calculates, based on the number of times Step S130 has been executed, the total amount of thickness cut from the working start cross section. Then, the control unit 11 calculates an error range of the calculated total amount with the use of the error range indicated by the error range information stored in advance in the storage unit 20. When the error range is ±10%, and the total amount is 20 nm, for example, the control unit 11 calculates the error range of the total amount to be from 18 nm to 22 nm. The control unit 11 redefines the upper limit value (in this example, 22 nm) of the calculated error range as the total amount of thickness cut from the working start cross section. The control unit 11 determines, based on the redefined total amount, and on the design data read in Step S210, whether the layer exposed as the cross section of the multilayered sample 7 by the processing of Step S220 executed last time is a top surface of any one of the plurality of observation target layers. When determining that the layer exposed as the cross section of the multilayered sample 7 by the processing of Step S220 executed last time is not the top surface of the observation target layer, the control unit 11 determines that exposure of the observation target layer at a cross section of the multilayered sample 7 is not detected. In contrast, when determining that the layer exposed as the cross section of the multilayered sample 7 by the processing of Step S220 executed last time is the top surface of the observation target layer, the control unit 11 determines that exposure of the observation target layer at a cross section of the multilayered sample 7 is detected. In this manner, the control unit 11 can prevent cutting, by overcutting the multilayered sample 7 due to the error, the top surface of the observation target layer before an observation image of the top surface of the observation target layer is formed.

The control unit 11 may be configured to determine, in Step S230, whether exposure of an observation target layer at a cross section of the multilayered sample 7 is detected by another method based on the design data read in Step S210, and on the redefined total amount.

When determining that exposure of an observation target layer at a cross section of the multilayered sample 7 is not detected (Step S230; NO), the control unit 11 transitions to Step S220, in which the exposure control is performed again.

In contrast, when determining that exposure of an observation target layer at a cross section of the multilayered sample 7 is detected (Step S230; YES), the control unit 11 repeatedly performs the processing of Step S250 and Step S260 a predetermined number of times (Step S240). The predetermined number of times is, for example, 10. The predetermined number of times may be a number that is smaller than 10, or a number that is larger than 10. Further, there may be adopted a configuration in which the predetermined number of times is included in, for example, the observation conditions and the working conditions, or is received in advance by the charged particle beam irradiation apparatus 100 separately from, for example, the observation conditions and the working conditions.

In Step S250, the control unit 11 performs the observation control (Step S250), in which the image forming unit 14 is controlled to form an observation image of the currently exposed cross section of the multilayered sample 7.

Next, the control unit 11 determines, based on the observation image formed in Step S250, whether the currently exposed cross section of the multilayered sample 7 is an observation target layer (Step S260). For example, the control unit 11 determines, in Step S260, whether the currently exposed cross section of the multilayered sample 7 is an observation target layer by, for example, pattern matching.

When determining that the currently exposed cross section of the multilayered sample 7 is not an observation target layer (Step S260; NO), the control unit 11 performs the exposure control (Step S270). Then, when the processing of Step S250 and Step S260 has not been repeated the predetermined number of times, the control unit 11 transitions to Step S250, in which the observation control is performed again. Alternatively, when the processing of Step S250 and Step S260 has been repeated the predetermined number of times, the control unit 11 performs, for example, error processing (not shown). The error processing is, for example, processing of controlling the display unit 17 to display information indicating that an observation target layer is not exposed at a cross section of the multilayered sample 7. Then, after performing the error processing, the control unit 11 ends the processing. The error processing may be other processing. Further, the control unit 11 may be configured to set the unit cutting thickness in the exposure control of Step S270 to be thinner than the unit cutting thickness in the exposure control of Step S220. In this case, it is desired that, as the unit cutting thickness in the exposure control of Step S270 becomes thinner, the predetermined number of times be increased. Further, the control unit 11 may be configured to set the unit cutting thickness in the exposure control of Step S220 to be thicker than the unit cutting thickness in the exposure control of Step S270. Stated differently, the control unit 11 may be configured to set the unit cutting thickness in the exposure control of Step S220 to a predetermined first cutting thickness, and set the unit cutting thickness in the exposure control of Step S270 to a predetermined second cutting thickness. It should be noted, however, that the first cutting thickness is a thickness that is thinner than the second cutting thickness. The first cutting thickness is an example of a first working pitch. The second cutting thickness is an example of a second working pitch.

In contrast, when determining that the currently exposed cross section of the multilayered sample 7 is an observation target layer (Step S260; YES), the control unit 11 proceeds to Step S280, in which it is determined whether to end forming an observation image of an observation target layer included in the multilayered sample 7.

As described above, the charged particle beam irradiation apparatus 100 determines, based on the design data stored in the storage unit 20, and on the received error range, whether exposure of an observation target layer at a cross section of the multilayered sample 7 is detected in the process of repeatedly performing the exposure control (that is, process in which the processing of from Step S220 to Step S280 is repeated), and repeats sequentially performing the exposure control and the observation control the predetermined number of times when determining that exposure of an observation target layer at a cross section of the multilayered sample 7 is detected in the process. In this manner, the charged particle beam irradiation apparatus 100 can prevent cutting, by overcutting due to the error, the top surface of the observation target layer before an observation image of the top surface of the observation target layer is formed, and at the same time, reduce the time required to observe the substance or structure of each of the plurality of observation target layers included in the multilayered sample 7.

<Modification Example 2 of the Processing in Which the Charged Particle Beam Irradiation Apparatus Forms an Observation Image of a Cross Section of the Multilayered Sample Every Time Exposure of an Observation Target Layer at a Cross Section of the Multilayered Sample Is Detected>

Figure 6:
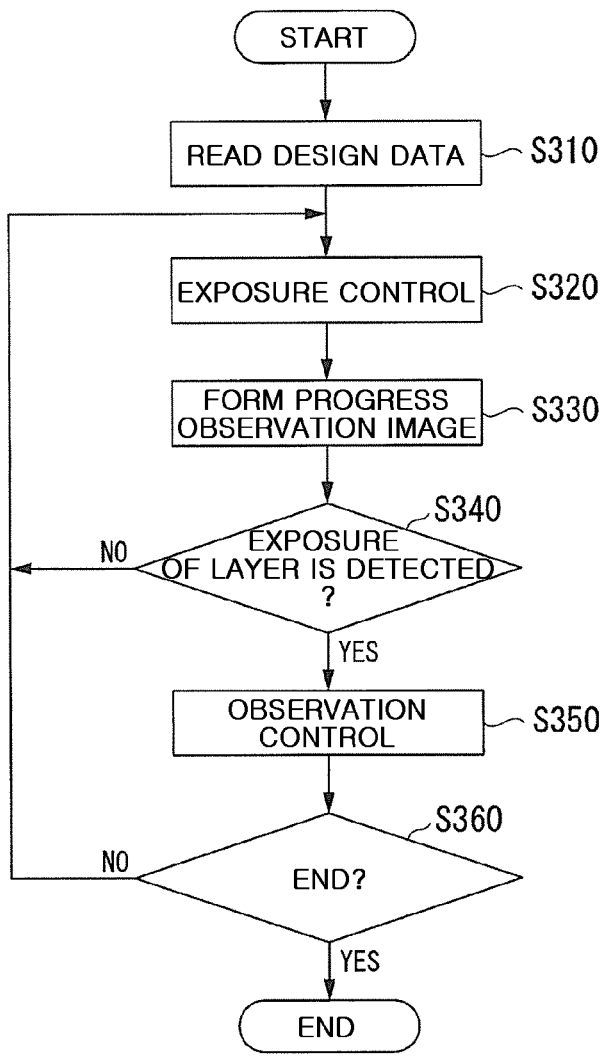
FIG. 6 is a flow chart for illustrating Modification Example 2 as an example of the processing in which the charged particle beam irradiation apparatus (100) forms an observation image of a cross section of the multilayered sample (7) every time exposure of an observation target layer at a cross section of the multilayered sample (7) is detected.

Now referring to FIG. 6, a description is given of Modification Example 2 of the processing in which the charged particle beam irradiation apparatus 100 forms an observation image of a cross section of the multilayered sample 7 every time exposure of an observation target layer at a cross section of the multilayered sample 7 is detected. FIG. 6 is a flow chart for illustrating Modification Example 2 as an example of the processing in which the charged particle beam irradiation apparatus 100 forms an observation image of a cross section of the multilayered sample 7 every time exposure of an observation target layer at a cross section of the multilayered sample 7 is detected.

A description is given below, as an example, of a case in which, at a timing before processing of Step S310 illustrated in FIG. 6 is performed, observation conditions and working conditions desired by a user are stored in advance in the storage unit 20. Further, a description is given below, as an example, of a case in which, at the timing, design data of the multilayered sample 7 is stored in advance in the storage unit 20.

Further, a description is given below, as an example, of a case in which, at a timing before the processing of Step S310 illustrated in FIG. 6 is performed, a working start cross section is exposed in advance by repeating the above-mentioned cut-and-see procedure.

The processing of Step S310 illustrated in FIG. 6 is processing similar to the processing of Step S110 illustrated in FIG. 4, and hence a description thereof is omitted. Further, processing of Step S320 illustrated in FIG. 6 is processing similar to the processing of Step S120 illustrated in FIG. 4, and hence a description thereof is omitted. Still further, processing of Step S350 illustrated in FIG. 6 is processing similar to the processing of Step S140 illustrated in FIG. 4, and hence a description thereof is omitted. Still further, processing of Step S360 illustrated in FIG. 6 is processing similar to the processing of Step S150 illustrated in FIG. 4, and hence a description thereof is omitted.

After the processing of Step S320 is performed, the control unit 11 controls the focused ion beam column 2 to radiate the focused ion beam 9, and controls the image forming unit 14 to form a progress observation image indicating progress of working the multilayered sample 7 with the focused ion beam 9 (Step S330).

Now, the processing of Step S330 is described in detail. The "progress observation image" refers to an observation image obtained by scanning a range including the above-mentioned first scanning region with the focused ion beam 9. In this case, however, the control unit 11 sets, in this scanning, an acceleration voltage, a beam current, and the like of the focused ion beam 9 to values with which the multilayered sample 7 is not cut away. As a result, the image forming unit 14 can form, as the progress observation image, the observation image based on the signal of the secondary electrons detected by the secondary electron detector 4 through the scanning without accompanying etching of the multilayered sample 7.

Figure 7:
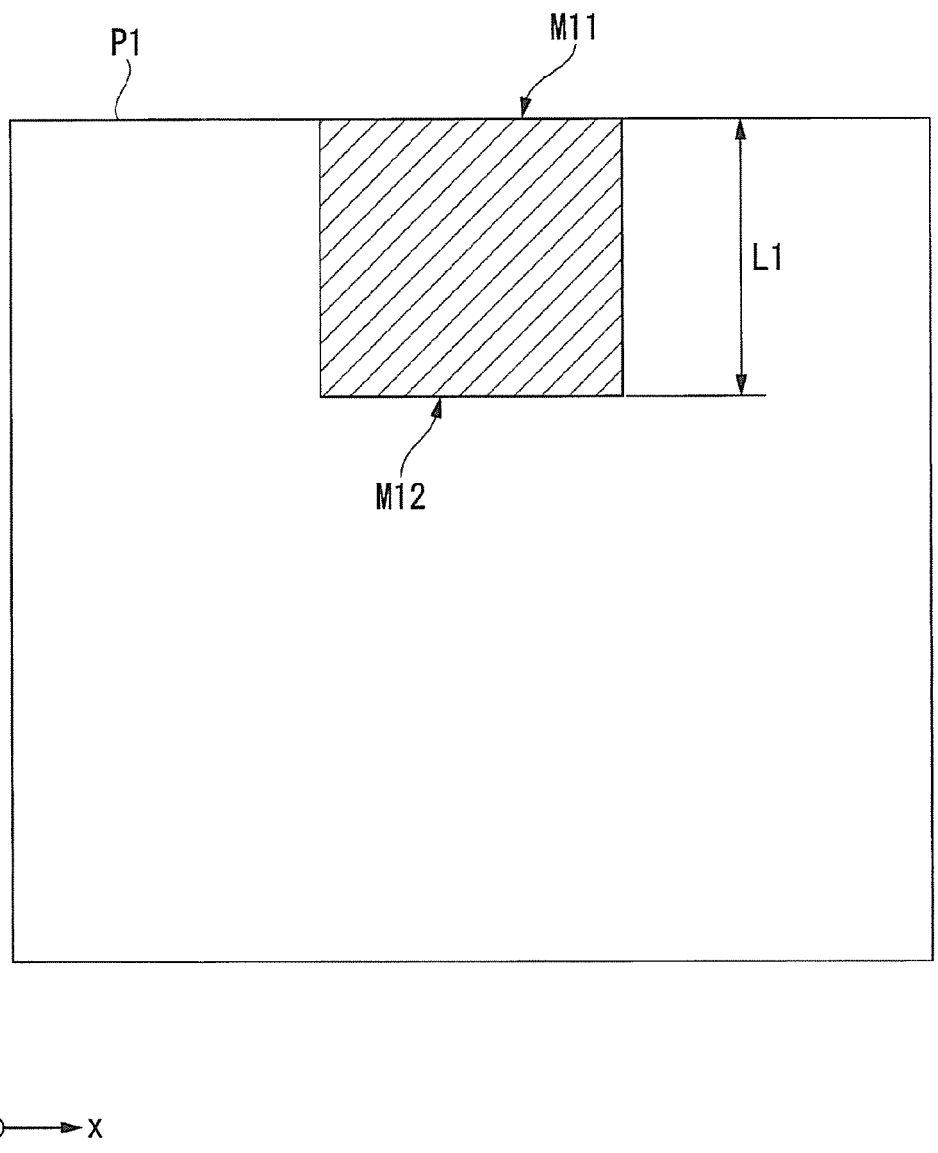
FIG. 7 is a diagram for illustrating an example of a progress observation image.

FIG. 7 is a diagram for illustrating an example of the progress observation image. An image P1 illustrated in FIG. 7 represents an example of the progress observation image. Further, a hatched region of a region on the image P1 represents an example of a region corresponding to a part etched by the focused ion beam 9 in the multilayered sample 7. Still further, in the image P1, a cross section M11 represents an example of the above-mentioned working start cross section. Still further, in the image P1, across section M12 represents an example of a currently exposed cross section of cross sections of the multilayered sample 7.

In such a progress observation image, only a region corresponding to the part etched by the focused ion beam 9 of the multilayered sample 7 is updated every time the processing of Step S330 is performed. Therefore, the control unit 11 may be configured to scan, in Step S330, only a part corresponding to the region updated in the progress observation image, of regions of the multilayered sample 7, with the focused ion beam 9. In this manner, the charged particle beam irradiation apparatus 100 can reduce the time required for the processing of Step S330, and as a result, more reliably reduce the time required to observe the substance or structure of each of the plurality of observation target layers included in the multilayered sample 7.

After the processing of Step S330 is performed, the control unit 11 determines, based on the design data read in Step S310, and on the progress observation image formed in Step S330, whether exposure of an observation target layer at a cross section of the multilayered sample 7 is detected (Step S340).

Now, the processing of Step S340 is described in detail. In Step S340, the control unit 11 can detect, by image processing based on the progress observation image, the thickness from the working start cross section to the currently exposed cross section, that is, the total amount of thickness by which the multilayered sample 7 has been cut from the working start cross section to the present. The total amount is, for example, a thickness L1 illustrated in FIG. 7. The image processing method with which the thickness from the working start cross section to the currently exposed cross section is detected may be a known method, or a method to be developed in the future. The control unit 11 determines, based on the detected total amount, and on the design data read in Step S310, whether the layer exposed as the cross section of the multilayered sample 7 in the processing of Step S320 executed last time is a top surface of any one of the plurality of observation target layers. When determining that the layer exposed as the cross section of the multilayered sample 7 by the processing of Step S320 executed last time is not the top surface of the observation target layer, the control unit 11 determines that exposure of an observation target layer at a cross section of the multilayered sample 7 is not detected. In contrast, when determining that the layer exposed as the cross section of the multilayered sample 7 by the processing of Step S320 executed last time is the top surface of the observation target layer, the control unit 11 determines that exposure of an observation target layer at a cross section of the multilayered sample 7 is detected.

The control unit 11 may be configured to determine in Step S340, by another method based on the design data read in Step S310, and on the total amount detected in Step S330, whether exposure of an observation target layer at a cross section of the multilayered sample 7 is detected.

When determining that exposure of an observation target layer at a cross section of the multilayered sample 7 is not detected (Step S340; NO), the control unit 11 transitions to Step S320, in which the exposure control is performed again.

In contrast, when determining that exposure of an observation target layer at a cross section of the multilayered sample 7 is detected (Step S340; YES), the control unit 11 proceeds to Step S350, in which the observation control is performed.

As described above, the charged particle beam irradiation apparatus 100 controls the focused ion beam column 2 to radiate the focused ion beam 9 every time the exposure control is performed in the process of repeatedly performing the exposure control (that is, process in which the processing of from Step S320 to Step S360 is repeated), controls the image forming unit 14 to form the progress observation image indicating the progress of working the multilayered sample 7 with the focused ion beam 9, determines, based on the progress observation image formed every time the exposure control is performed, and on the design data stored in the storage unit 20, whether exposure of an observation target layer at a cross section of the multilayered sample 7 is detected in the process, and performs the observation control when determining that exposure of an observation target layer at a cross section of the multilayered sample 7 is detected in the process. In this manner, the charged particle beam irradiation apparatus 100 can reduce the time required to observe the substance or structure of each of the plurality of observation target layers included in the multilayered sample 7 based on the progress observation image.

<Modification Example 3 of the Processing in Which the Charged Particle Beam Irradiation Apparatus Forms an Observation Image of a Cross Section of the Multilayered Sample Every Time Exposure of an Observation Target Layer at a Cross Section of the Multilayered Sample Is Detected>

Figure 8:
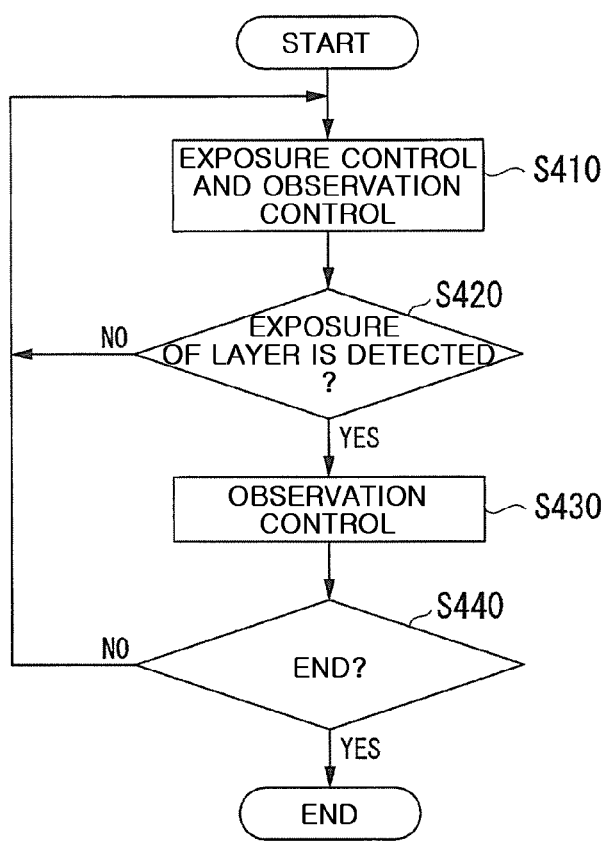
FIG. 8 is a flow chart for illustrating Modification Example 3 as an example of the processing in which the charged particle beam irradiation apparatus (100) forms an observation image of a cross section of the multilayered sample (7) every time exposure of an observation target layer at a cross section of the multilayered sample (7) is detected.

Now referring to FIG. 8, a description is given of Modification Example 3 of the processing in which the charged particle beam irradiation apparatus 100 forms an observation image of a cross section of the multilayered sample 7 every time exposure of an observation target layer at a cross section of the multilayered sample 7 is detected. In Modification Example 3 of the processing in which the charged particle beam irradiation apparatus 100 forms an observation image of the cross section of the multilayered sample 7 every time exposure of an observation target layer at a cross section of the multilayered sample 7 is detected, the charged particle beam irradiation apparatus 100 performs the processing without using the design data of the multilayered sample 7. FIG. 8 is a flow chart for illustrating Modification Example 3 as an example of the processing in which the charged particle beam irradiation apparatus 100 forms an observation image of the cross section of the multilayered sample 7 every time exposure of an observation target layer at a cross section of the multilayered sample 7 is detected.

A description is given below, as an example, of a case in which, at a timing before processing of Step S410 illustrated in FIG. 8 is performed, observation conditions and working conditions desired by a user are stored in advance in the storage unit 20.

Processing of Step S430 illustrated in FIG. 8 is processing similar to the processing of Step S140 illustrated in FIG. 4, and hence a description thereof is omitted. Further, processing of Step S440 illustrated in FIG. 8 is processing similar to the processing of Step S150 illustrated in FIG. 4, and hence a description thereof is omitted.

The control unit 11 controls the focused ion beam column 2 and the electron beam column 1 to perform the exposure control and the observation control in parallel with each other (Step S410). Stated differently, in Step S410, the control unit 11 performs the cut-and-see procedure in parallel. As a result, the control unit 11 controls, in the observation control performed in parallel with the exposure control, the image forming unit 14 to form an observation image of the cross section of the multilayered sample 7. It should be noted, however, that when performing the observation control in parallel with the exposure control, a resolution of the observation image of the cross section of the multilayered sample 7 tends to be lower than a resolution of an observation image of the cross section of the multilayered sample 7 formed when the observation control is performed separately from the exposure control. However, the resolution of the observation image of the cross section of the multilayered sample 7 formed when the observation control is performed in parallel with the exposure control is a resolution that is sufficient to determine whether the observation image is an observation image of an observation target layer. By thus performing the observation control in parallel with the exposure control, the charged particle beam irradiation apparatus 100 can reduce the time required to observe the substance or structure of each of the plurality of observation target layers included in the multilayered sample 7 as compared to the case in which the cut-and-see procedure is generally repeated.

Here, the control unit 11 may be configured to radiate the focused ion beam 9 and the electron beam 8 alternately by a time-sharing function, may be configured to radiate the focused ion beam 9 and the electron beam 8 at the same time or substantially at the same time, or may be configured to perform scanning alternately with the focused ion beam 9 and the electron beam 8 line by line (scanning line by scanning line) in Step S410. Further, the control unit 11 may be configured to control the image forming unit 14 to form an observation image based on the secondary electrons generated in the multilayered sample 7 by irradiation with the focused ion beam 9 without performing irradiation with the electron beam 8 in Step S410.

After the processing of Step S410 is performed, the control unit 11 determines, based on the observation image of the cross section of the multilayered sample 7 formed in Step S410, whether exposure of an observation target layer at a cross section of the multilayered sample 7 is detected (Step S420).

Now, the processing of Step S420 is described in detail. The control unit 11 determines, based on the observation image of the cross section of the multilayered sample 7 formed in Step S410, and on a machine learning model obtained by learning in advance an image of each of the observation target layers included in the multilayered sample 7, whether the layer exposed as the cross section of the multilayered sample 7 by the processing of Step S410 executed last time is a top surface of any one of the plurality of observation target layers. This model is, for example, a convolutional neural network, but without limited thereto, may be, for example, another neural network or deep learning. Alternatively, the control unit 11 may be configured to determine, without using the model, and based on the observation image of the cross section of the multilayered sample 7 formed in Step S410, and on pattern matching with an image of each of the observation target layers included in the multilayered sample 7, whether the layer exposed as the cross section of the multilayered sample 7 by the processing of Step S410 executed last time is a top surface of any one of the plurality of observation target layers. When determining that the layer exposed as the cross section of the multilayered sample 7 by the processing of Step S410 executed last time is not the top surface of the observation target layer, the control unit 11 determines that exposure of the observation target layer at a cross section of the multilayered sample 7 is not detected. In contrast, when determining that the layer exposed as the cross section of the multilayered sample 7 by the processing of Step S410 executed last time is the top surface of the observation target layer, the control unit 11 determines that exposure of the observation target layer at a cross section of the multilayered sample 7 is detected.

When determining that exposure of an observation target layer at a cross section of the multilayered sample 7 is not detected (Step S420; NO), the control unit 11 transitions to Step S410, in which the exposure control and the observation control are performed in parallel with each other again.

In contrast, when determining that exposure of an observation target layer at a cross section of the multilayered sample 7 is detected (Step S420; YES), the control unit 11 proceeds to Step S430, in which the observation control is performed.

As described above, the charged particle beam irradiation apparatus 100 determines, based on the observation image of the cross section of the multilayered sample 7 formed every time the observation control is performed in parallel with the exposure control, and on the machine learning model obtained by learning in advance the image of each of the observation target layers, whether exposure of an observation target layer at a cross section of the multilayered sample 7 is detected in the process of repeatedly performing the exposure control (that is, process in which the processing of from Step S410 to Step S440 is repeated), and performs the observation control when determining that exposure of an observation target layer at a cross section of the multilayered sample 7 is detected in the process. In this manner, the charged particle beam irradiation apparatus 100 can reduce, without using the design data of the multilayered sample 7, and based on the machine learning model, the time required to observe the substance or structure of each of the plurality of observation target layers included in the multilayered sample.

Further, the charged particle beam irradiation apparatus 100 determines, based on the observation image of the cross section of the multilayered sample 7 formed every time the observation control is performed in parallel with the exposure control, and on pattern matching with an image of each of the observation target layers, whether exposure of an observation target layer at a cross section of the multilayered sample 7 is detected in the process of repeatedly performing the exposure control (that is, process in which the processing of from Step S410 to Step S440 is repeated), and performs the observation control when determining that exposure of an observation target layer at a cross section of the multilayered sample 7 is detected in the process. In this manner, the charged particle beam irradiation apparatus 100 can reduce, without using the design data of the multilayered sample 7, and based on the pattern matching, the time required to observe the substance or structure of each of the plurality of observation target layers included in the multilayered sample.

<Specific Example of a Configuration of the Multilayered Sample 7>

Figure 9:
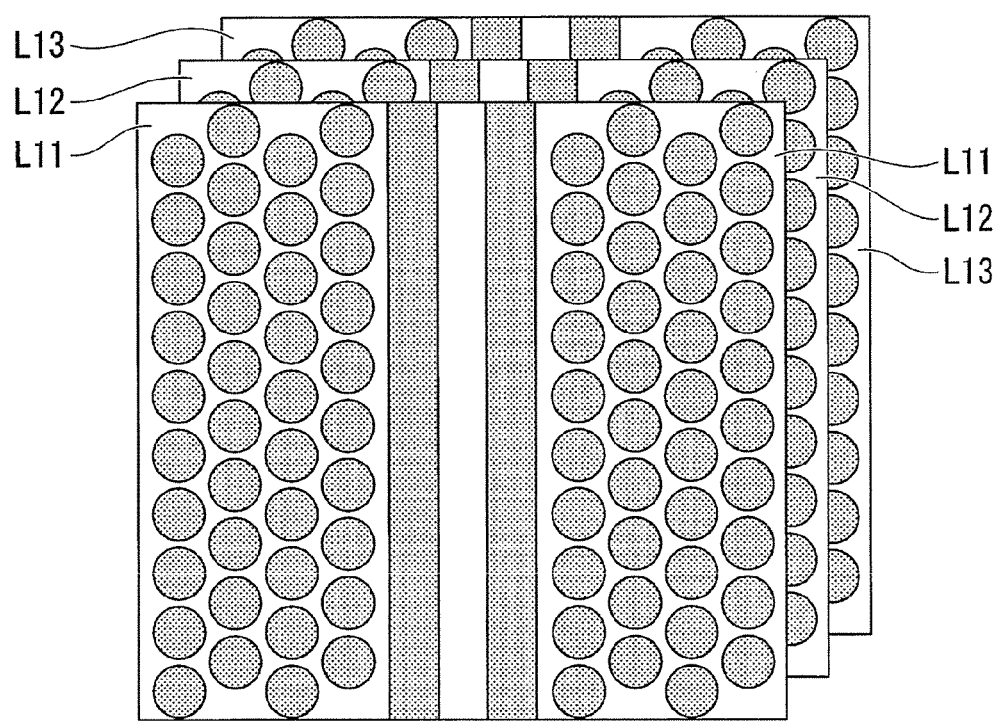
FIG. 9 is a perspective view for illustrating an example of a configuration of the multilayered sample (7).
Figure 10:
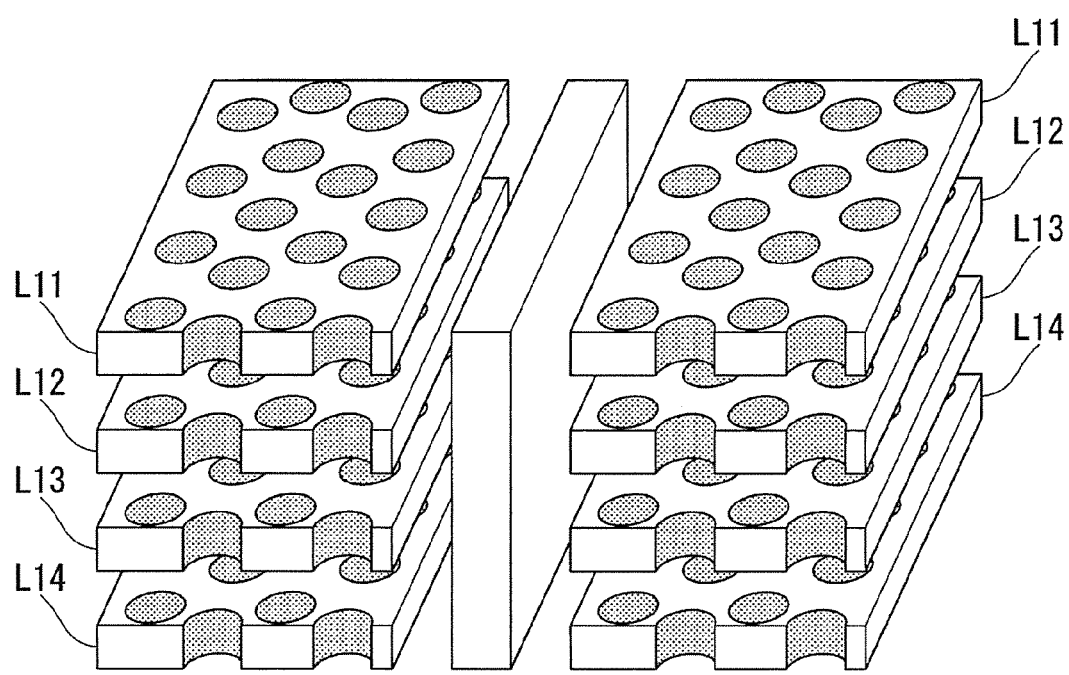
FIG. 10 is a perspective view of the multilayered sample (7) illustrated in FIG. 9 as viewed in a direction different from that of FIG. 9.

Now referring to FIG. 9 and FIG. 10, a specific example of a configuration of the multilayered sample 7 is described. FIG. 9 is a perspective view for illustrating an example of the configuration of the multilayered sample 7. FIG. 10 is a perspective view of the multilayered sample 7 illustrated in FIG. 9 as viewed in a direction different from that of FIG. 9. In FIG. 9 and FIG. 10, in order to prevent the figures from becoming complicated, the non-observation target layers are omitted. Further, in FIG. 9, in order to prevent the figure from becoming complicated, only three observation target layers are illustrated. Similarly, in FIG. 10, in order to prevent the figure from becoming complicated, only four observation target layers are illustrated. Each of an observation target layer L11 to an observation target layer L13 illustrated in FIG. 9 and FIG. 10 is an example of the observation target layers included in the multilayered sample 7. Similarly, an observation target layer L14 illustrated in FIG. 10 is also an example of the observation target layers included in the multilayered sample 7.

As illustrated in FIG. 9 and FIG. 10, in the multilayered sample 7, a plurality of observation target layers (that is, observation target layer L11 to observation target layer L14) are stacked. Further, those observation target layers have different substances or structures from one another. Still further, in the example illustrated in FIG. 9 and FIG. 10, the observation target layers are sectioned into two parts by a rectangular parallelepiped object. Such a section may or may not be present in the multilayered sample 7. Still further, in this example, those observation target layers have formed therein a plurality of structures penetrating through the observation target layers in the stacking direction in which those observation target layers are stacked. In FIG. 9 and FIG. 10, those structures are illustrated by hatched circles or cylinders. When the presence or absence of such structures is observed at the cross section of the multilayered sample 7, it is desired that, as in the charged particle beam irradiation apparatus 100 according to at least one embodiment of the present invention, the axial direction of the irradiation axis of the electron beam column 1 and the direction in which the structures penetrate through the observation target layers be parallel to each other. In this respect, it can be said that, as in the charged particle beam irradiation apparatus 100 according to at least one embodiment of the present invention, a relationship in which the axial direction of the irradiation axis of the focused ion beam column 2 and the direction in which the structures penetrate through the observation target layers are orthogonal to each other is suitable for observing an observation image of the cross sections of the multilayered sample 7 illustrated in FIG. 9 and FIG. 10. A shape of each of the above-mentioned structures may be any shape. Further, a size of each of the above-mentioned structures may be any size. Still further, a material of the above-mentioned structures may be any material.

In the case where the design data is used in the charged particle beam irradiation apparatus 100 described above, the charged particle beam irradiation apparatus 100 may be configured to identify a desired layer as an observation target layer by the user specifying the desired layer for the charged particle beam irradiation apparatus 100 based on the design data, and to control, when the identified observation target layer is exposed as a cross section of the multilayered sample 7, the image forming unit 14 to form an observation image of the exposed cross section. In this case also, as the method of determining whether exposure of the desired layer at a cross section of the multilayered sample 7 is detected, the method described above is applied.

At least one embodiment of the present invention has been described above in detail with reference to the drawings. However, the specific configuration is not limited to this embodiment, and modifications may be made thereto as appropriate without departing from the spirit of the present invention. Further, the embodiments described above may be combined as appropriate without departing from the spirit of the present invention.

Each of the apparatus described above includes a computer. Processes of the processing of each of the apparatus described above are stored in a form of a program in a computer-readable recording medium, and when the program is read and executed by the computer, the processing described above is performed. The "computer-readable recording medium" as used herein refers to, for example, a magnetic disk, a magneto-optical disk, a CD-ROM, a DVD-ROM, or semiconductor memory. Alternatively, the computer program may be distributed to the computer via a communication line, and the computer having received the distribution may execute the program.

Further, the above-mentioned program may be intended to achieve a part of the functions described above. Further, the above-mentioned program may enable the functions described above to be achieved when being combined with a program that is already recorded in a computer system, and may be what is called a differential file (differential program).

What is claimed is:

1. A charged particle beam irradiation apparatus, comprising:
   a focused ion beam column configured to irradiate, with a focused ion beam, a multilayered sample in which a plurality of layers having one of different substances and different structures from one another are stacked in a predetermined stacking direction as observation target layers to be observed;
   an electron beam column configured to irradiate the multilayered sample with an electron beam;
   an electron detector configured to detect one of secondary electrons and reflection electrons generated from the multilayered sample;
   and
   a control unit configured to repeatedly perform exposure control in which the focused ion beam column is controlled to expose a cross section of the multilayered sample toward the predetermined stacking direction with the focused ion beam,
   the control unit being configured to perform, every time exposure of one of the observation target layers at a cross section of the multilayered sample is detected in a process of repeatedly performing the exposure control, observation control in which the electron beam column is controlled to radiate the electron beam, and observation image of the cross section of the multilayered sample is formed.

2. The charged particle beam irradiation apparatus according to claim 1, further comprising a storage unit having stored therein design data of the multilayered sample,
   wherein the control unit is configured to:
   determine, based on the design data stored in the storage unit, whether exposure of one of the observation target layers at a cross section of the multilayered sample is detected in the process; and
   perform the observation control when determining that exposure of one of the observation target layers at a cross section of the multilayered sample is detected in the process.

3. The charged particle beam irradiation apparatus according to claim 2, wherein the control unit is configured to:
   determine, based on the design data stored in the storage unit, and on a received error range, whether exposure of one of the observation target layers at a cross section of the multilayered sample is detected in the process; and
   repeat sequentially performing the exposure control and the observation control a predetermined number of times when determining that exposure of one of the observation target layers at a cross section of the multilayered sample is detected in the process.

4. The charged particle beam irradiation apparatus according to claim 3, wherein the control unit is configured to set a first working pitch in the exposure control that is repeated the predetermined number of times to be smaller than a second working pitch in the exposure control that is different from the exposure control that is repeated the predetermined number of times.

5. The charged particle beam irradiation apparatus according to claim 2, wherein the control unit is configured to:
   control the focused ion beam column to radiate the focused ion beam;
   determine, based on a progress observation image which indicates progress of working the multilayered sample with the focused ion beam and is formed every time the exposure control is performed in the process, and on the design data stored in the storage unit, whether exposure of one of the observation target layers at a cross section of the multilayered sample is detected in the process; and
   perform the observation control when determining that exposure of one of the observation target layers at a cross section of the multilayered sample is detected in the process.

6. The charged particle beam irradiation apparatus according to claim 1, wherein the control unit is configured to:
   control the focused ion beam column and the electron beam column to perform the exposure control and the observation control in parallel with each other;
   determine, based on the observation image of a cross section of the multilayered sample, which is formed every time the observation control is performed in parallel with the exposure control, whether exposure of one of the observation target layers at a cross section of the multilayered sample is detected in the process; and
   perform the observation control when determining that exposure of one of the observation target layers at a cross section of the multilayered sample is detected in the process.

7. The charged particle beam irradiation apparatus according to claim 6, wherein the control unit is configured to:
determine, based on the observation image of the cross section of the multilayered sample, which is formed every time the observation control is performed in parallel with the exposure control, whether exposure of one of the observation target layers at a cross section of the multilayered sample is detected in the process; and
perform the observation control when determining that exposure of one of the observation target layers at a cross section of the multilayered sample is detected in the process.

8. The charged particle beam irradiation apparatus according to claim 6, wherein the control unit is configured to:
determine, based on the observation image of the cross section of the multilayered sample, which is formed every time the observation control is performed in parallel with the exposure control, whether exposure of one of the observation target layers at a cross section of the multilayered sample is detected in the process; and
perform the observation control when determining that exposure of one of the observation target layers at a cross section of the multilayered sample is detected in the process.

9. A control method for a charged particle beam irradiation apparatus, the control method comprising:
repeatedly performing exposure control in which a focused ion beam column is controlled to expose a cross section of a multilayered sample in which a plurality of layers having one of different substances and different structures from one another are stacked in a predetermined stacking direction as observation target layers to be observed, toward the predetermined stacking direction with a focused ion beam; and
performing, every time exposure of one of the observation target layers at a cross section of the multilayered sample is detected in a process of repeatedly performing the exposure control, observation control in which an electron beam column is controlled to radiate an electron beam, and an observation image of the cross section of the multilayered sample is formed based on a signal output from an electron detector configured to detect one of secondary electrons and reflection electrons generated from the multilayered sample.

10. The control method according to claim 9,
wherein the charged particle beam irradiation apparatus further includes a storage unit having stored therein design data of the multilayered sample, and
wherein the control method further comprises:
determining, based on the design data stored in the storage unit, whether exposure of one of the observation target layers at a cross section of the multilayered sample is detected in the process; and
performing the observation control when determining that exposure of one of the observation target layers at a cross section of the multilayered sample is detected in the process.

11. The control method according to claim 10, further comprising:
determining, based on the design data stored in the storage unit, and on a received error range, whether exposure of one of the observation target layers at a cross section of the multilayered sample is detected in the process; and
repeating sequentially performing the exposure control and the observation control a predetermined number of times when determining that exposure of one of the observation target layers at a cross section of the multilayered sample is detected in the process.

12. The control method according to claim 11, further comprising setting a first working pitch in the exposure control that is repeated the predetermined number of times to be smaller than a second working pitch in the exposure control that is different from the exposure control that is repeated the predetermined number of times.

13. The control method according to claim 10, further comprising:
controlling the focused ion beam column to radiate the focused ion beam;
determining, based on a progress observation image which indicates progress of working the multilayered sample with the focused ion beam and is formed every time the exposure control is performed in the process, and on the design data stored in the storage unit, whether exposure of one of the observation target layers at a cross section of the multilayered sample is detected in the process; and
performing the observation control when determining that exposure of one of the observation target layers at a cross section of the multilayered sample is detected in the process.

14. The control method according to claim 9, further comprising:
controlling the focused ion beam column and the electron beam column to perform the exposure control and the observation control in parallel with each other;
determining, based on the observation image of a cross section of the multilayered sample, which is formed every time the observation control is performed in parallel with the exposure control, whether exposure of one of the observation target layers at a cross section of the multilayered sample is detected in the process; and
performing the observation control when determining that exposure of one of the observation target layers at a cross section of the multilayered sample is detected in the process.

15. The control method according to claim 14, further comprising:
determining, based on the observation image of the cross section of the multilayered sample, which is formed every time the observation control is performed in parallel with the exposure control, whether exposure of one of the observation target layers at a cross section of the multilayered sample is detected in the process; and
performing the observation control when determining that exposure of one of the observation target layers at a cross section of the multilayered sample is detected in the process.

16. The control method according to claim 14, further comprising:
determining, based on the observation image of the cross section of the multilayered sample, which is formed every time the observation control is performed in parallel with the exposure control, whether exposure of one of the observation target layers at a cross section of the multilayered sample is detected in the process; and
performing the observation control when determining that exposure of one of the observation target layers at a cross section of the multilayered sample is detected in the process.

* * * * *